(12) United States Patent
Scholl et al.

(10) Patent No.: US 6,818,103 B1
(45) Date of Patent: Nov. 16, 2004

(54) METHOD AND APPARATUS FOR SUBSTRATE BIASING IN MULTIPLE ELECTRODE SPUTTERING SYSTEMS

(75) Inventors: Richard A. Scholl, Fort Collins, CO (US); Abraham Belkind, North Plainfield, NJ (US)

(73) Assignee: Advanced Energy Industries, Inc., Fort Collins, CO (US)

( * ) Notice: Subject to any disclaimer, the term of this patent is extended or adjusted under 35 U.S.C. 154(b) by 0 days.

(21) Appl. No.: 10/110,496

(22) PCT Filed: Oct. 13, 2000

(86) PCT No.: PCT/US00/28482

§ 371 (c)(1),
(2), (4) Date: Apr. 12, 2002

(87) PCT Pub. No.: WO01/29278

PCT Pub. Date: Apr. 26, 2001

Related U.S. Application Data

(60) Provisional application No. 60/159,896, filed on Oct. 15, 1999.

(51) Int. Cl.[7] .............................................. C23C 14/34
(52) U.S. Cl. .......................... 204/192.12; 204/298.06; 204/298.08; 204/298.14
(58) Field of Search ...................... 204/192.12, 298.06, 204/298.08, 298.14

(56) References Cited

U.S. PATENT DOCUMENTS

| | | | |
|---|---|---|---|
| 3,436,332 A | 4/1969 | Oda et al. ................... | 204/298 |
| 3,464,907 A | 9/1969 | Froemel et al. ............. | 204/192 |
| 3,507,774 A | 4/1970 | Muly, Jr. et al. ............ | 204/298 |

(List continued on next page.)

FOREIGN PATENT DOCUMENTS

| | | |
|---|---|---|
| DE | 42 37 517 A1 | 5/1994 |
| DE | 44 38 463 C1 | 2/1996 |
| EP | 0591675 A1 | 8/1993 |
| EP | 0692550 A1 | 1/1996 |
| JP | 59096266 | 6/1984 |
| JP | 60256819 | 12/1985 |
| WO | WO 01/29278 | 4/1998 |
| WO | WO 98/54749 | 12/1998 |

OTHER PUBLICATIONS

"A Quasi–direct–current Sputtering Technique ForThe Deposition Of Dielectrics At Enhanced Rates", by G. Este and W.D. Westwood, J. Vac. Sci, Technol. A 6(3) May/Jun. 1988, American Vacuum Society, pp. 1845–1848.

"Pulsed Magnetron Sputter Technology", by S. Schiller, K. Goedicke, J. Reschke, V. Kirchhoff, S. Schneider and F. Milde, Apr. 19–23, 1993, submitted to International Conference On Metallurgical Coatings And Thin Films, ICM-CTF93, San Diego, California, pp. 1–24.

US Application, "Method and Apparatus for Providing Substrate Bombardment in dual Cathode or Dual Anode Sputter Deposition", s/n 60/159,896, filed Oct. 15, 1999, specification 15 pages, drawings 5 pages.

*Primary Examiner*—Rodney G. McDonald
(74) *Attorney, Agent, or Firm*—Santangelo Law Offices, P.C.

(57) ABSTRACT

A method and an apparatus are disclosed for causing ion bombardment of the substrate during sputter deposition of an insulating or conducting material on a substrate (3) when using dual cathode or dual anode sputtering approaches. A novel electrical circuit including a center-tapped transformer is disclosed to permit a controllable potential to be applied to the substrate relative to the plasma potential, without the necessity of an additional power supply. Also disclosed are approaches which permit the use of an auxiliary biasing supply (8), either dc or high frequency ac, and which can permit continuous discharging of the surface through alternate ion and electron bombardment.

13 Claims, 5 Drawing Sheets

U.S. PATENT DOCUMENTS

| | | |
|---|---|---|
| 3,562,142 A | 2/1971 | Lamont, Jr. |
| 3,676,320 A | 7/1972 | Christensen et al. ......... 204/192 |
| 3,709,809 A | 1/1973 | Wright et al. ................ 204/192 |
| 4,201,654 A | 5/1980 | Castleman .................. 204/298 |
| 4,247,383 A | 1/1981 | Greve et al. ................. 204/298 |
| 4,693,805 A | 9/1987 | Quazi ......................... 204/192 |
| 4,853,102 A | 8/1989 | Tateishi et al. .............. 204/298 |
| 4,986,890 A | 1/1991 | Setoyama et al. ...... 204/298.06 |
| 4,988,422 A | 1/1991 | Wirz ..................... 204/192.15 |
| 5,006,192 A | 4/1991 | Deguchi ...................... 156/345 |
| 5,178,739 A | 1/1993 | Barnes et al. ........... 204/192.12 |
| 5,241,152 A | 8/1993 | Anderson et al. ....... 219/121.57 |
| 5,415,757 A | 5/1995 | Szcyrbowski et al. ....... 204/298 |
| 5,417,834 A | 5/1995 | Latz ...................... 204/298.11 |
| 5,460,707 A | 10/1995 | Wellerdieck ............ 204/298.08 |
| 5,512,164 A | 4/1996 | Timberlake ................. 205/186 |
| 5,616,225 A | 4/1997 | Sieck et al. ............. 204/298.14 |
| 5,718,813 A | 2/1998 | Drummond et al. ... 204/192.12 |
| 5,882,492 A | 3/1999 | Manley et al. ......... 204/298.08 |
| 5,897,753 A | 4/1999 | Schatz et al. ........... 204/192.12 |

METHOD AND APPARATUS FOR SUBSTRATE BIASING IN MULTIPLE ELECTRODE SPUTTERING SYSTEMS

This application is a United States National Phase Application filing under 35 U.S.C. 371 of International Patent Application, Ser. No. PCT/US00/28482, filed 13 Oct. 2000, which claims the benefit of and priority from U.S. patent application No. 60/159,896 (the Original U.S. application), filed 15 Oct. 1999, the PCT application being filed while the Original U.S. application was pending; each hereby incorporated by reference.

I. TECHNICAL FIELD

The present invention generally relates to reactive plasma sputter deposition techniques for forming and depositing films on substrates and, more particularly, is concerned with a system and method for sputter deposition of a material on a substrate using dual cathode or dual anode systems.

II. BACKGROUND

Sputter deposition is a process wherein a target, usually a metal, is placed in position near a plasma (a cloud of ions and electrons in equal numbers), in a chamber in which most of the air has been withdrawn. Well-known conventional means are used to create the plasma. A negative voltage is produced on the target, or cathode, relative to a separate electrode called the anode by connecting the negative lead of a dc power supply to the target. The negative voltage on the target attracts the ions from the plasma, which are accelerated toward the target. Upon arrival the collision of the ions with the target physically knocks out target atoms. These target atoms travel from the target to a substrate placed nearby, which becomes coated with them. The expelled target atoms also coat every other surface in the system, as for the most part they are neutral and there is no practical way to direct their path. When ions are withdrawn from the plasma, there immediately exists an excess of electrons in the plasma. These excess electrons are attracted to the positive lead of the dc power supply used to create the target voltage, which positive lead is connected to a separate electrode called the anode or alternatively to the chamber walls, either of which, in collecting the electrons, provide for plasma current flow and therefore may be considered as plasma current providing elements.

As described, this is a very common process for deposition of thin layers of metals. It is widely used in the processing of semiconductors, and in creating the reflecting layer on compact discs and CD-ROMS, active layers on hard discs for computer storage, and layers of metals for many other functional and decorative applications.

The process described above is called dc sputtering, and requires that the target (or cathode) be conducting, because the ions arriving at the target must be able to accept one or more electrons from the target to become neutral gas atoms again in order to prevent charging of the target surface, which would create a retarding potential which would stop the process very quickly. Insulators do not have free electrons available for this purpose, so that an insulating target material cannot be used. On the other hand, one can deposit layers of insulating material from a metallic target, by forming the insulator chemically through reaction with a reactive background gas. This is called reactive sputtering. For example, $Al_2O_3$ and $SiO_2$ can be created from aluminum and silicon targets, respectively, if oxygen gas is present in appropriate quantities in the background gas filling the chamber.

There is increasing commercial interest in processes involving deposition of such insulating films. This interest comes about at least in part because of the application of such processes to the deposition of wear resistant coatings; insulating films for microcircuits (including devices such as thin film heads) or electronic devices such as capacitors; sophisticated architectural glass coatings; coatings on polyester film for architectural glass laminates or oxygen barriers for food packaging; heat reflecting coatings for high efficiency lamps or induction furnace heat shields; deposition of barrier and functional layers for flat panel displays, including the ITO glass used in LCD displays; and myriad other similar functional applications. Added to this are the many reactive PVD processes used to create decorative effects on a wide variety of plastic, natural and artificial fiber, and metal substrates.

A problem occurs in these and other cases, however, when the reaction product is an electrical insulator. Since, as described above, the insulating film coats every surface in the chamber (which it will eventually do) then it will surely eventually coat the anode. As this happens the conduction path for the electrons is coated over, and the process cannot be sustained. This has been termed the "disappearing anode" problem. In the past the reactive process was run until this effect began to create serious problems, whereupon the system was opened to mechanically scrub off the offending insulating layer from the anode to create a new metallic surface. Thus, continuous operation without this maintenance was not possible.

Another drawback related to the coating of the anode with an insulator is that this insulator will generally charge up as the electrons attempt to collect there. This charge can cause an electric field in the insulating film on the anode which may exceed the dielectric strength of the film material. When this occurs an arc may be formed and the energy in this arc may cause portions of the film to be ejected from the anode, creating particles which can become included in the film growing on the substrate, causing defects which may be unacceptable in the final product.

Este, et al, in an article entitled "A Quasi-direct-current Sputtering Technique for the Deposition of Dielectrics at Enhanced Rates", published in *J. Vac. Sci. Technol. A*, vol. 6, No. 3 (May/June 1988), proposed an approach to the sputtering process which uses two targets alternately for deposition of dielectric or insulating films. The power supply, which in this case has an alternating potential output, is connected to the two targets so that they are driven alternatively positive and negative with respect to one another. This causes each to act as an anode for the other. If the reversal takes place often enough, only a very thin layer of insulator will be formed on the target acting as an anode, and this very thin layer can be sputtered away when it is that target's turn to be negative. This is possible because the insulator does not stop the sputtering process at once, but due to charging effects its presence will slow and eventually stop the process. If the layer is very thin, it can be sputtered away before the process stops. The usual time for reversal is a few tens of microseconds, in order that there be too little time for a thick layer to form. See also the paper by Schiller et al entitled "Pulsed Magnetron Sputter Technology", published in the Proceedings of the 1993 International Conference on Metallurgical Coatings and Thin Films, Surf. Coat. Tech. Vol. 61, (1993) page 331, which covers a dual magnetron target approach similar to that of Este et al in that each of the targets acts within one cycle of the output of the power supply once as the cathode and once as the anode. This method is generally called "dual cathode sputtering".

For the most part this has proved to be a successful approach to the problem of the "disappearing anode". It does have the disadvantage, however, of requiring two targets, which adds to the expense of the system and also complicates the maintenance. Also, it is difficult to retrofit this dual target process into existing sputtering systems because there often is no room for the second target. In addition, large anode potentials in such a system due to the magnetic field over the target cause a loss in deposition rate and higher substrate heating.

Another approach to the problem is described in U.S. Pat. No. 5,897,753, issued Apr. 27, 1999, entitled "Continuous Deposition of Insulating Material using Multiple Anodes Alternated between Positive and Negative Voltages", hereby incorporated by reference. In this approach two or more anodes are provided and driven alternatively positive and negative, permitting each to be sputtered and therefore cleaned once each cycle. This method, when two anodes are provided, may be called "dual anode sputtering", and addresses some of the problems of dual cathode sputtering.

Now it can be important, in order to obtain dense high quality films, to cause the growing film to be bombarded by ions. This ion bombardment can increase the density and quality of the film by increasing the surface energy of the film, causing the arriving atoms to more easily find the lowest energy point in the growing lattice of atoms. In conventional sputtering with a single target and single anode, this ion bombardment can be provided by causing the substrate to be held at a negative potential relative to the anode, and thus to the plasma (in the conventional single target configuration, the plasma is usually slightly more positive than the anode). This negative substrate potential may attract ions from the plasma, providing the desired bombardment. If the growing film is electrically conductive, this substrate bias may be easily provided by connecting a dc power supply between the substrate and the anode. If the film is insulating, a high frequency supply may be connected in the same way to produce a negative surface potential through preferential electron attraction at the peaks of each cycle since electrons are lighter and more mobile than ions. In either case, the connection to the anode is effective because this element is usually close in potential to the plasma.

Both the dual cathode and dual anode approach present a problem for the user who wishes to enhance ion bombardment of the substrate, because in both approaches the powering system is floating with respect to the chamber, and there is no single electrode which remains close in electrical potential to the plasma.

Consequently a need exists for a method of providing for the substrate a consistent controllable negative electrical potential relative to the plasma, and thus provide a means of controllable ion bombardment of the substrate.

III. DISCLOSURE OF INVENTION

It is an object of the present invention, therefore, to provide a means of biasing the substrate in a dual anode or dual cathode sputtering system.

It is a further object of this invention to provide biasing of the substrate in a dual anode or dual cathode sputtering system without the need for a separate substrate biasing supply.

It is yet another object of the present invention to provide biasing of the substrate in a dual anode or dual cathode sputtering system in a simple, reliable manner regardless of the electrical conductivity of the growing film on the substrate.

Accordingly, the present invention is directed to a system for sputter deposition of an electrically insulating or conducting material on a substrate while simultaneously bombarding the depositing film with ions. The present invention discloses a novel connection to the substrate or substrate holder to permit this, using the same power supply as is used to power the cathode or cathodes, with or without an auxiliary biasing supply.

In one embodiment, perhaps employing the dual cathode arrangement, a transformer is provided with a center tap in its secondary which may be used to produce a pulsating negative voltage for biasing the substrate.

In another embodiment, perhaps employing the dual anode arrangement, a novel connection to the cathode through a dropping resistor may be used to provide the required negative potential relative to the plasma.

In any of these embodiments, it may be desirable for the substrate to be held negative with respect to the plasma so that it may be bombarded with ions, at least during part of the cycle of coating, and preferably for a large percentage of the cycle time. This may be done intrinsically, or by the addition of an auxiliary power supply, and this auxiliary supply may produce direct current power or alternating power.

IV. BRIEF DESCRIPTIONS OF THE DRAWINGS

Figure 3:
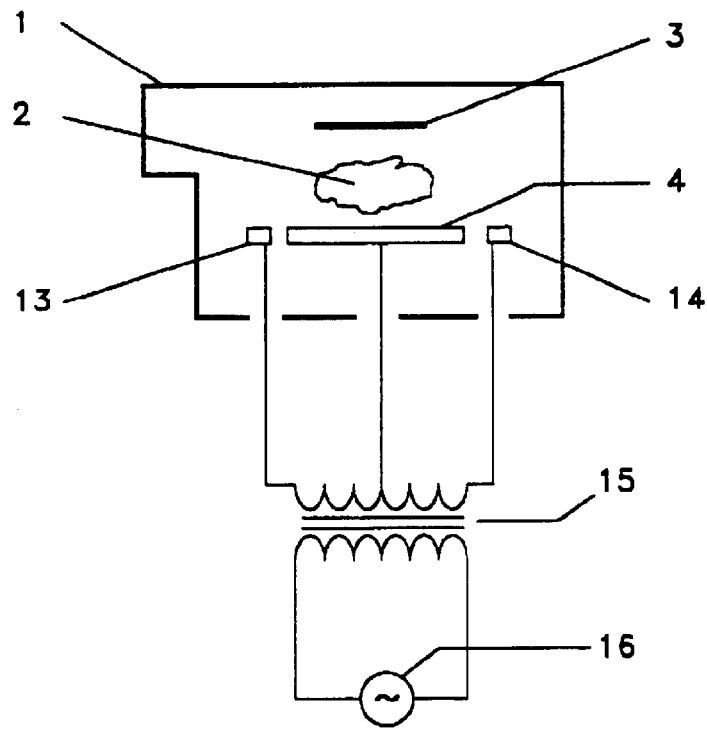

FIG. 3 shows an improvement to an arrangement such as described in U.S. Pat. No. 5,897,753 with two anodes driven by an alternating voltage source with the voltage on the two anodes $180_1$ out of phase from one another.

Figure 4:
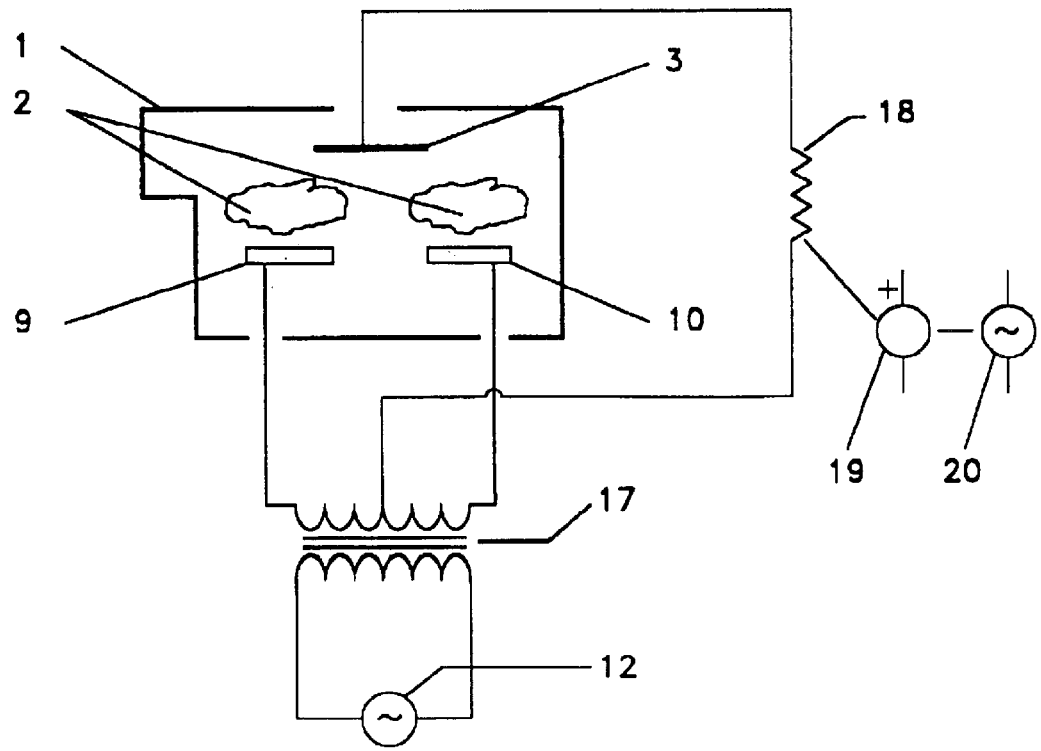

FIG. 4 shows several embodiments of the present invention with dual cathode sputtering.

Figure 5:
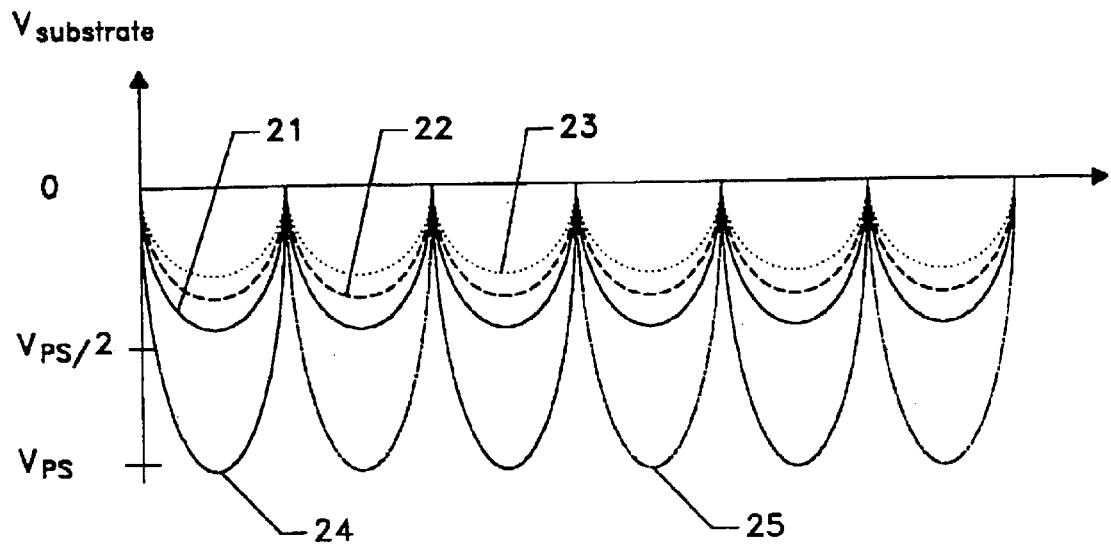

FIG. 5 shows the electrical potential on the substrate relative to the plasma for one embodiment of the present invention shown in FIG. 4.

Figure 6:
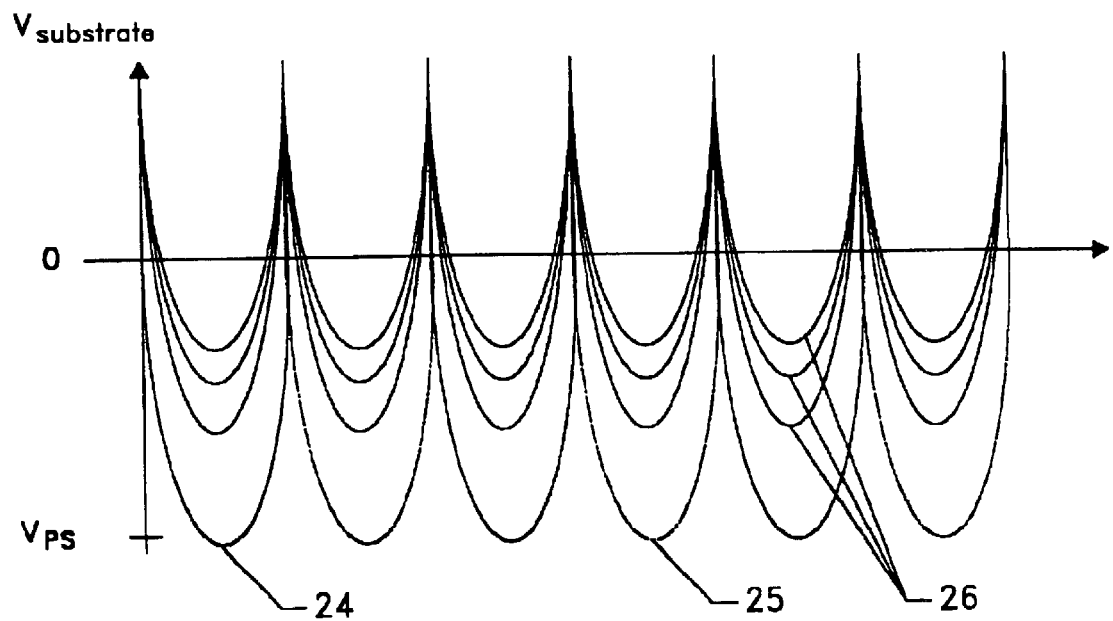

FIG. 6 shows the electrical potential on the substrate relative to the plasma for another embodiment of the present invention shown in FIG. 4.

Figure 7:
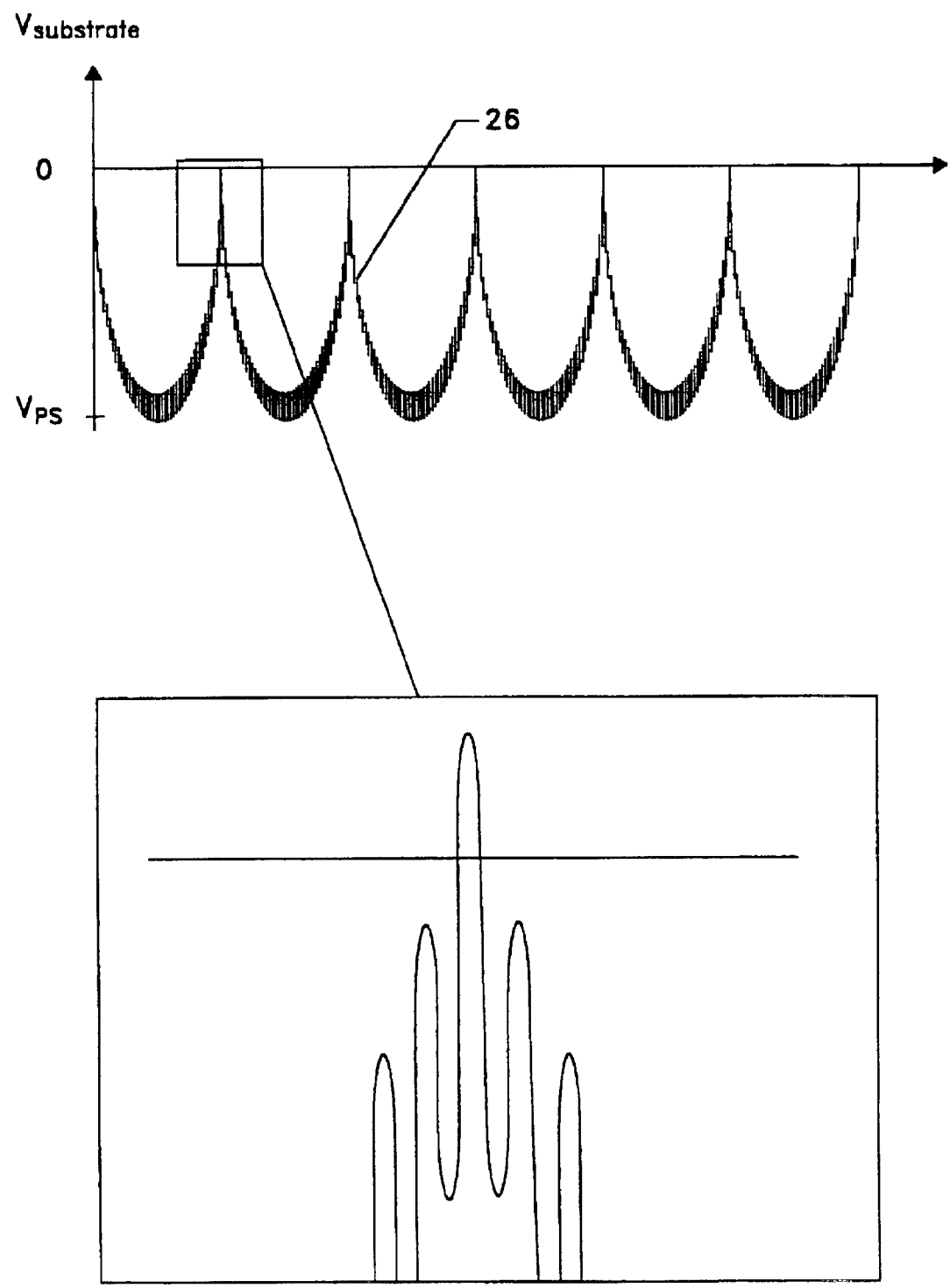

FIG. 7 shows the electrical potential on the substrate relative to the plasma for a third embodiment of the present invention shown in FIG. 4.

Figure 8:
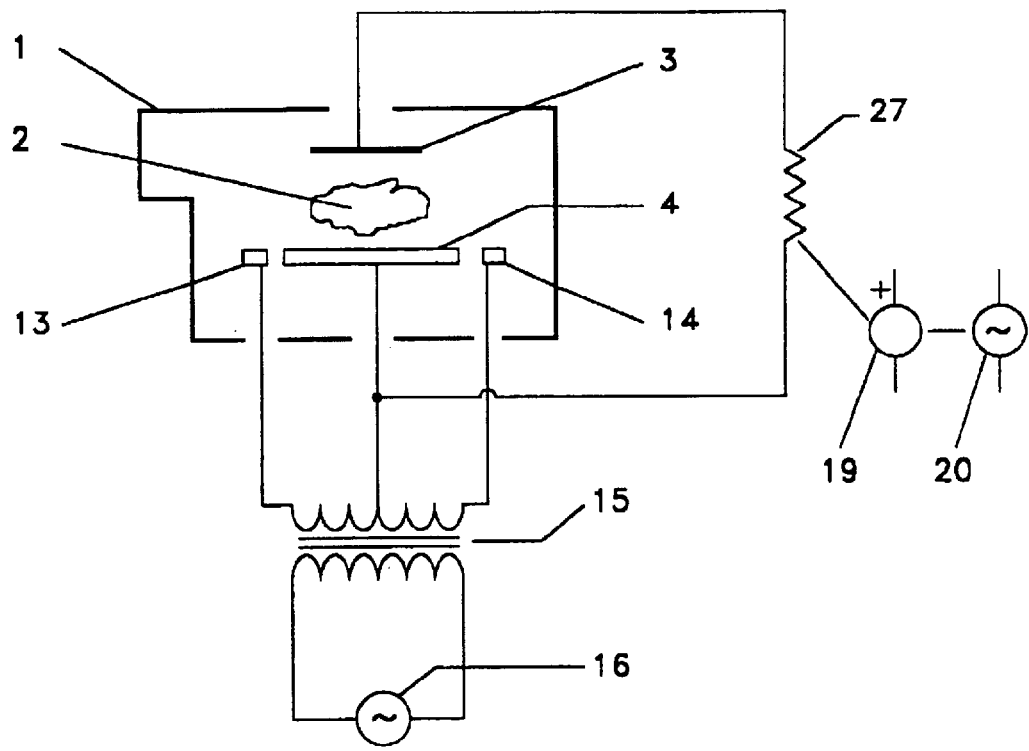

FIG. 8 shows several embodiments of the present invention with dual anode sputtering.

Figure 9:
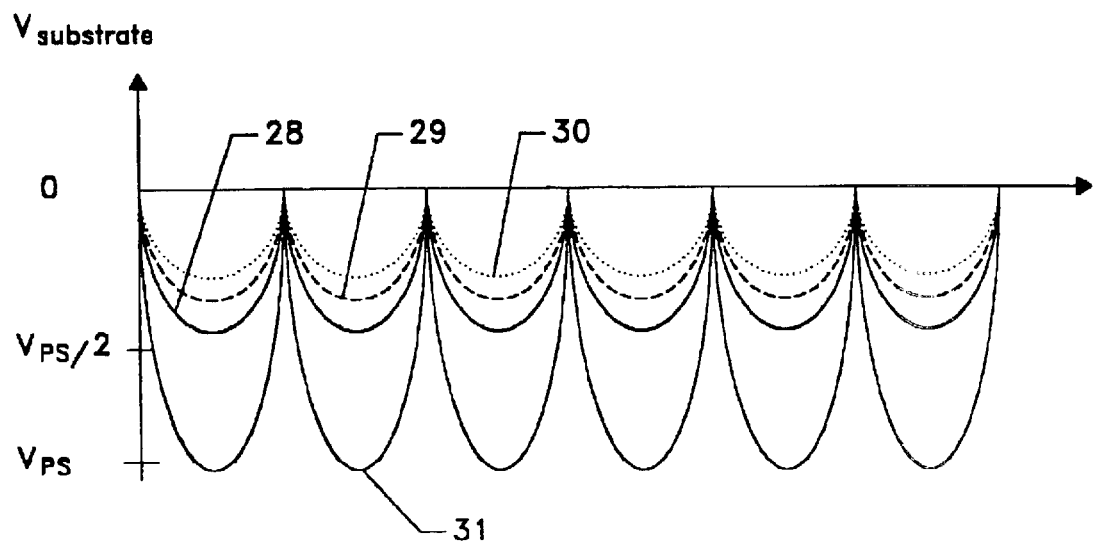

FIG. 9 shows the electrical potential on the substrate relative to the plasma for one of the embodiments of the present invention shown in FIG. 8.

V. MODE(S) FOR CARRYING OUT THE INVENTION

As can be easily understood, the basic concepts of the present invention may be embodied in a variety of ways. It involves both processes or methods as well as devices to accomplish such. In addition, while some specific circuitry is disclosed, it should be understood that these not only accomplish certain methods but also can be varied in a number of ways. Importantly, as to all of the foregoing, all of these facets should be understood to be encompassed by this disclosure.

Figure 1:
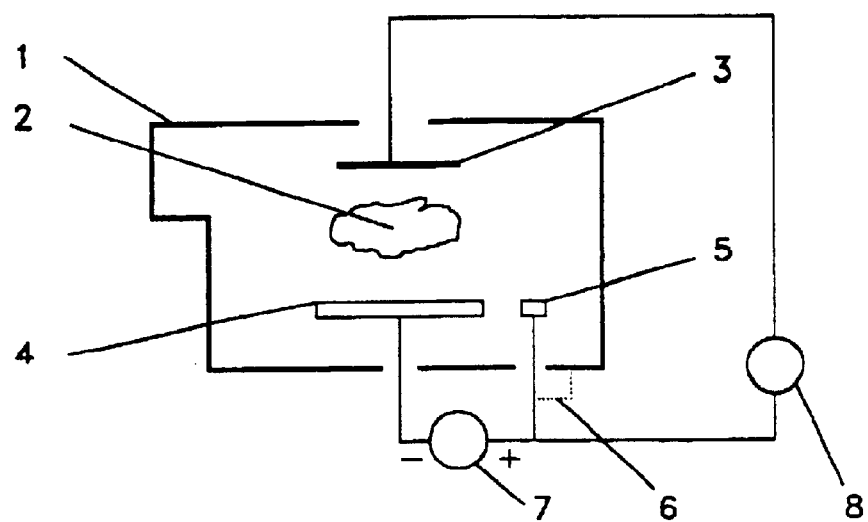
FIG. 1 shows a conventional single target sputtering system using dc power, and indicating the use of a dc or ac biasing supply to provide substrate bias.

FIG. 1 shows a conventional single target system. In this case there may exist a discrete anode 5 or an alternative connection 6 may be made whereby the positive lead of sputtering power supply 7 is connected to the chamber 1 rather than to anode 5. In this case anode 5 may be dispensed with. The alternative connection 6 is shown in dotted lines in FIG. 1. Ions are attracted to target 4 from plasma 2 and upon striking target 4 cause sputtered atoms to be ejected from target 4 in accordance with well-known principles. These sputtered atoms traverse the space between the target and the substrate 3 and deposit there, creating a thin film of the target material thereupon. If biasing is desired, it may be accomplished by the connection of a biasing power supply 8 connected between the positive lead of power supply 7 (and therefore anode 5 or chamber 1, depending upon the connection) and substrate 3. Biasing supply 8 is connected to produce a negative potential between substrate 3 and plasma 2, attracting ions from plasma 2 to bombard the substrate. If the substrate and film are conductive, a direct current power supply may be utilized, in which case the positive lead of biasing supply 8 can be connected to the positive lead of power supply 7 and the negative lead to substrate 3. If the substrate or the growing film is not conductive, an alternating power supply may be used, so as to cause electrons to be attracted to the surface of substrate 3 at the peak of each cycle, causing a "self bias" potential which is negative and therefore attractive to ions during the bulk of the alternating cycle in the manner known in the prior art. The frequency of alternation of bias supply 8 in this case may be determined by the thickness of the substrate or growing film; if the substrate is conductive and the insulating film thin, a relatively low frequency may be utilized, otherwise radio frequencies may be required to maintain the self bias potential.

Figure 2:
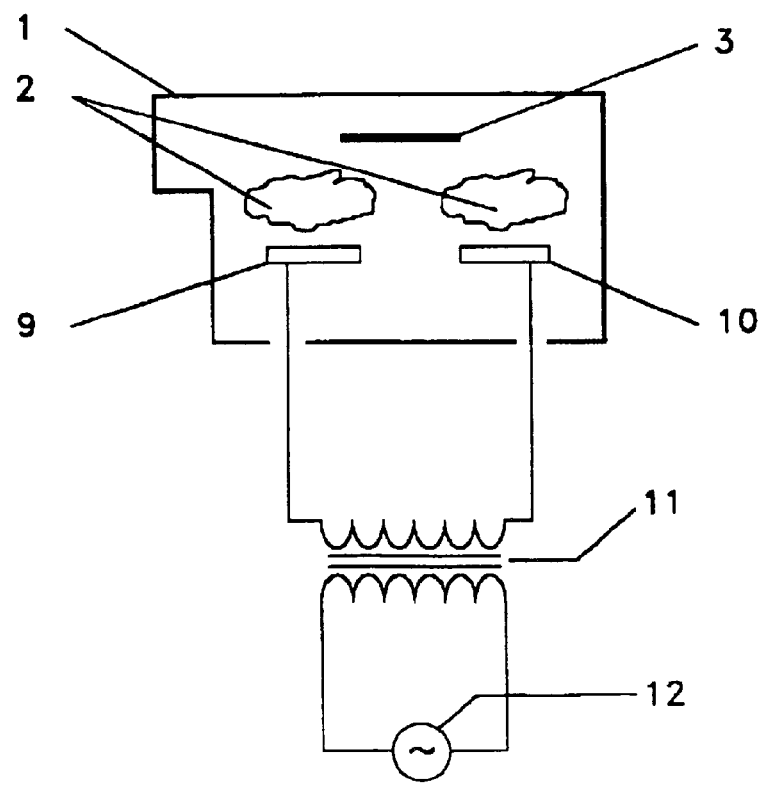
FIG. 2 shows a conventional dual target sputtering system using ac power.

As previously mentioned, if a reactive gas is introduced into chamber 1 in order to create a chemical compound on the target, and if the reaction product is an electrical insulator, the insulating film will likely coat every surface in the chamber 1, and will eventually coat the anode (or in the case of the alternative connection, the chamber walls). As this happens the conduction path for the electrons streaming from the plasma 2 may be coated over, and the process cannot be sustained. This is what has been termed the "disappearing anode" problem. This problem seems to have inspired the invention of the system shown in FIG. 2. In FIG. 2 two targets 9 and 10 are disposed in the space normally occupied by the single target 4 in FIG. 1 and no separate anode is provided. A source of alternating power 12 may be applied between the two targets 9 and 10 through isolating transformer 11. In this way target 9 can act as an anode for target 10 when the voltage between the targets is such that target 9 is positive with respect to target 10. Similarly, target 10 can act as an anode for target 9 when the voltage between the targets is such that target 10 is positive with respect to target 9. Because the power supply 12 may be an alternating source of power, this situation may be reversed every half cycle of the current. If the reversal takes place often enough, only a very thin layer of insulator will be formed on target 9 when it is acting as an anode, and this very thin layer can be sputtered away when it is the turn of target 9 to be negative. The same may be said for target 10. Normally in systems such as shown in FIG. 2 the frequency of the power supply 12 is about 40 kHz, corresponding to a reversal every 12.5 μs.

As mentioned previously, this has proved to be a successful approach but has the disadvantage of requiring two targets 9 and 10, adding to the expense of the system and complicating maintenance. This and other problems with the dual cathode approach inspired the invention described in the '753 patent and now the new improvement of such systems such an improvement is shown in FIG. 3. It will be noted that there is no dc supply shown in FIG. 3, yet the target by the nature of the plasma is driven negative on each half cycle and is therefore sputtered. Thus, the equivalent of a dc power supply is created from the ac supply driving the anodes through the novel use of a tapped transformer and the action of the plasma. This is a considerable improvement over the system described in U.S. application Ser. No. 08/864,766, now U.S. Pat. No. 5,897,753, and its Continuation application Ser. No. 09/285,353, each hereby incorporated by reference. This surprising way of achieving the desired results presents a considerable economic, practical, and maintenance advantage for such systems. In chamber 1 are disposed substrate 3, target 4, and at least two anodes 13 and 14. A power supply 16 provides an alternating voltage isolated by transformer 15 (which strictly transform or may even be a 1:1 "transformer" so as to merely isolate) to the two anodes such that when anode 13 is driven positive, anode 14 is driven negative and vice versa. The secondary of transformer 15 has a "tap", by which we mean that a connection is made to the secondary winding at a point removed from the ends. The tap may be usually at the electrical center of the transformer so as to effect an equal division of the voltage. Target 4 is held negative with respect to plasma 2 by the action of electrons arriving at one of the other of the two anodes 13 and 14. These electrons arrive at anode 13 when the cycle drives it in a positive direction, forcing the potential of anode 13 to remain near to the potential of plasma 2, and as a result also forcing the potential of anode 14 and target 4 to be driven negative relative to the plasma. The arrival of ions at target 4 and anode 14 due to this negative potential causes sputtering and so deposition of the material from target 4 and simultaneous cleaning of anode 14. On the other half of the cycle of power supply 16 electrons arrive at anode 14, forcing the potential of anode 14 to remain near to the potential of plasma 2, and as a result also forcing the potential of anode 13 and target 4 to be driven negative relative to the plasma. The arrival of ions at target 4 and anode 13 due to this negative potential causes sputtering and so deposition of the material from target 4 and simultaneous cleaning of anode 13.

Thus each of the anode elements 13 and 14 act alternatively as true anodes (electron collectors) and as sputtered cathodes (ion collectors) depending upon the instantaneous polarity of the ac power supply 16, while target 4 is sputtered on every half cycle.

Another embodiment of the present invention is shown in FIG. 4, in this case for the dual cathode system. The secondary of isolation transformer 17 has been tapped, and a connection made from the tap to substrate 3 through a resistor 18, whose value of resistance determines the current flow to the substrate and therefore the voltage there. Alternatively, resistor 18 may be replaced by DC power supply 19 or high frequency ac power supply 20. The voltage on the substrate relative to the plasma (and therefore the accelerating potential for ions from the plasma) is shown in FIG. 5. Here all voltages are represented relative to the plasma potential. The voltage on target 9 (Target A in FIG. 4) is shown as waveform 24 in FIG. 5. This is a half-sinusoid (of course, it may also be any alternating waveform or one which merely approximates a portion of a sinusoid) repeated once per cycle, when target 9 is acting as a cathode. During the alternate half cycle, target 9 is acting as an anode and is at a small potential relative to the plasma. The voltage on target 10 (Target B in FIG. 4) is shown as waveform 25 in FIG. 5, and is a half-sinusoid alternated with waveform 24.

The voltage on substrate 3 is also half sinusoidal, but repeats every half cycle as shown in FIG. 5 as waveforms 21, 22, and 23. The physical reasons for the production of this waveform at the tap of transformer 17 is outlined above under the discussion of FIG. 3 and dual anode sputtering. The repeating negative voltage at the substrate will attract ions from the plasma to create ion bombardment in the manner known in the art. If resistor 18 is of large value, what ion current flows will create a large voltage drop across it, and the ion current to the substrate will be limited, creating waveform 23. If resistor 18 is made progressively smaller, larger currents will flow creating waveforms 22 and 21. Thus the ion bombardment of the substrate from the plasma may be controlled by the selection of resistance of resistor 18.

The resistance is not an insignificant value and is expected to be greater than or even substantially greater than an intrinsic amount. The value of resistance may be determined by dividing the available cathode voltage (i.e., the voltage at the tap of the transformer with respect to the plasma) by the desired ion current (or by the ion desired current density multiplied by the substrate area). (Some potential values may, of course, be set out in the various references.) Because the substrate will assume a negative potential relative to the plasma of just sufficient magnitude to attract the desired current, the actual current obtained with the calculated resistance will be slightly lower, equal to the difference between the substrate potential and the potential at the transformer tap. If this error is not acceptable, a second calculation for the resistance may be done by dividing the difference potential by the desired current and adjusting the resistance to the recalculated value. This will generally produce a resulting current close to the desired value.

For the alternate embodiment of the invention shown in FIG. 4, using dc bias supply 19 in lieu of resistor 18, the waveform of voltage on the substrate is shown in FIG. 6. As in FIG. 5, the voltages on targets 9 and 10 are shown in FIG. 6 as waveforms 24 and 25. The other waveforms 26 shown in FIG. 6 are the voltage on the substrate for various output voltages of dc bias supply 19.

FIG. 7 indicates the substrate voltage for the third embodiment of the invention in FIG. 4, using ac bias supply 20. Here the waveform is shown for a value of ac bias from power supply 20 relatively small when compared to the induced substrate voltage from ac cathode sputtering supply 12, but it will be seen that the relative value of voltage from supply 20 and supply 12 can be varied as desired to produce the desired results. If the ac bias supply 20 operates at a high enough frequency, it may be used with entirely insulating, relatively thick substrates.

A desirable frequency for ac bias supply 20 can be determined by the thickness of the insulating film plus the thickness of the insulating portion of the substrate (if any), and the dielectric constant of the insulating material. In general, a voltage will be dropped across the insulating regions equal to the ion current density to the substrate times the thickness of the insulating regions, divided by the dielectric constant of the insulating material multiplied by the frequency in radians per second. Thus the higher the frequency the lower the voltage. The voltage thus calculated subtracts from the available power supply voltage, and so should be small compared to it. In practice if the voltage thus calculated is less than 10–15% of the power supply voltage it will be tolerable, and so the frequency should be high enough to cause this to be the case. Since the thickness of the insulating regions may vary over a wide range, so will the allowable frequency, and the frequency may be as low as a few tens of hertz to as high as a few tens of megahertz. At frequencies high enough that electrons cannot cross the cathode dark space in a single period (generally above about 100 MHZ), however, no bias can be created and the system will cease to be optimally effective.

Naturally, the resistor and an ac or dc power supply may be used in combination, with the power supply (19 or 20) in series or parallel with resistor 18 to achieve the desired results.

FIG. 8 shows several embodiments of the present invention when used with dual anode sputtering. In this case transformer 15 is already tapped, as is necessary for the dual anode sputtering approach. In a similar way to the case of dual cathode sputtering, the substrate may be connected to the transformer tap through biasing resistor 27, and alternatively the resistor may be replaced or augmented by dc power supply 19 or ac power supply 20. FIG. 9 indicates the voltage on substrate 3 with respect to the plasma for various values of resistor 27; note the similarity to FIG. 5. One could draw the waveforms for the embodiments using a dc bias supply 19 or ac bias supply 20 as well; these drawings would be nearly identical to those in FIGS. 6 and 7 and so have not been provided here.

In general, an increase in the value of the series resistor 18 in FIG. 4 or resistor 27 in FIG. 8 will reduce the current flowing to substrate 3, and for larger values, most of the voltage on the tap of transformer 17 in FIG. 4 or transformer 15 in FIG. 8 will be dropped across the bias resistor. This means that the ions arriving at substrate 3 will be at a substantially lower energy than those arriving at target 4, and for a large range of resistance values will be low enough to avoid re-sputtering of the deposited film. As those of ordinary skill in the art would readily understand the discussion earlier regarding the resistance values and determinatons and other aspects applies similarly to these embodiments as well.

As mentioned earlier, this invention can be embodied in a variety of ways. In addition, each of the various elements of the invention and claims may also be achieved in a variety of manners. This disclosure should be understood to encompass each such variation, be it a variation of an embodiment of any apparatus embodiment, a method or process embodiment, or even merely a variation of any element of these. Particularly, it should be understood that as the disclosure relates to elements of the invention, the words for each element may be expressed by equivalent apparatus terms or method terms—even if only the function or result is the same. Such equivalent, broader, or even more generic terms should be considered to be encompassed in the description of each element or action. Such terms can be substituted where desired to make explicit the implicitly broad coverage to which this invention is entitled. As but one example, it should be understood that all action may be expressed as a means for taking that action or as an element which causes that action. Similarly, each physical element disclosed should be understood to encompass a disclosure of the action which that physical element facilitates. Regarding this last aspect, the disclosure of an "insulator" should be understood to encompass disclosure of the act of "insulating"—whether explicitly discussed or not—and, conversely, were there only disclosure of the act of "insulating", such a disclosure should be understood to encompass disclosure of an "insulator." Such changes and alternative terms are to be understood to be explicitly included in the description.

The foregoing discussion and the claims which follow describe the preferred embodiments of the invention. Particularly with respect to the claims it should be understood that changes may be made without departing from their essence. In this regard it is intended that such changes would still fall within the scope of the present invention. It is simply not practical to describe and claim all possible revisions which may be accomplished to the present invention. To the extent such revisions utilize the essence of the invention each would naturally fall within the breadth of protection accomplished by this patent. This is particularly true for the present invention since its basic concepts and understandings are fundamental in nature and can be applied in a variety of ways to a variety of fields. Further, it should be understood that method and apparatus claims may also be presented which address even only a self biasing system. Including, but not limited to aspects addressed in materials incorporated by reference or even the following for example:

A substrate enhanced sputtering system comprising: a chamber within which a plasma is established; at least two electrodes disposed in said chamber which function as the same type of electrode at some time during processing; and an alternating power source which supplies power to said electrodes at a frequency such that at least one of said electrodes assumes a self bias potential which is negative relative to the plasma; or separately A substrate enhanced sputtering system as described in the foregoing and further comprising a secondary tap responsive to a secondary winding of a transformer, or separately A method of substrate enhanced sputtering comprising the steps of: establishing a plasma in a chamber; alternating a supply of power between at least two electrodes disposed in said chamber which function as the same type of electrode at some time during processing at a frequency such that at least one of said electrodes assumes a self bias potential which is negative relative to the plasma; and sputtering material within said chamber; or separately A method of substrate enhanced sputtering as described in the forgoing and further comprising the step of connecting a processing surface to a tap of a secondary winding of a transformer.

The applicant(s) should also be understood to be able to claim at least: i) each of the plasma sputter deposition techniques, systems, and power supplies as herein disclosed and described, ii) the related methods disclosed and described, iii) similar, equivalent, and even implicit variations of each of these techniques and methods, iv) those alternative designs which accomplish each of the functions shown as are disclosed and described, v) those alternative designs and methods which accomplish each of the functions shown as are implicit to accomplish that which is disclosed and described, vi) each feature, component, and step shown as separate and independent inventions, vii) the applications enhanced by the various systems or components disclosed, viii) the resulting products produced by such systems or components, and ix) methods and apparatuses substantially as described hereinbefore and with reference to any of the accompanying examples, and x) the various combinations and permutations of each of the elements disclosed.

Furthermore, the earlier priority application, U.S. application No. 60/159,896 (with its incorporated references) and any other references mentioned in the application for this patent as well as all references listed in any list of references to be incorporated filed with the present and/or earlier application are hereby incorporated by reference in their entirety. However, to the extent statements might be considered inconsistent with the patenting of this/these invention(s) such statements are expressly not to be considered as made by the applicant(s).

It should be also noted that the term "at least (one) (two) (etc)" as used in the description and claims is not intended nor used in this disclosure to mean that other claims or descriptions not incorporating the "at least one" language cannot further include one or more like elements. More specifically, the language "at least one" or the like is not intended nor used to change "open-ended" claims, inherently including devices or methods having additional elements or steps apart from those claimed, into "closed-ended" claims wherein devices or methods having additional elements would not be covered by such claims. Accordingly, if or when used, the use of the transitional phrase "comprising" is used to maintain the "open-end" claims herein, according to traditional claim interpretation. Thus, unless the context requires otherwise, it should be understood that the term "comprise" or variations such as "comprises" or "comprising", are intended to imply the inclusion of a stated element or step or group of elements or steps but not the exclusion of any other element or step or group of elements or steps. Such terms should be interpreted in their most expansive form so as to afford the applicant the broadest coverage legally permissible. In addition, as to each term used it should be understood that unless its utilization in this application is inconsistent with such interpretation, common dictionary definitions should be understood as incorporated for each term and all definitions, alternative terms, and synonyms such as contained in the Random House Webster's Unabridged Dictionary, second edition are hereby incorporated by reference.

What is claimed is:

1. A substrate enhanced sputtering system comprising:
   a. a chamber within which a plasma is established;
   b. an alternating power source which supplies power to said plasma;
   c. a transformer having a primary winding and a secondary winding;
   d. a secondary tap responsive to said secondary winding of said transformer;
   e. a target disposed within said chamber and having material for sputter processing; and
   f. a substrate disposed within said chamber so as to be affected by said material from said target,
   wherein said substrate acts as a cathode.

2. A substrate enhanced sputtering system as described in claim 1 wherein said target comprises a cathode, and further comprising an anode disposed within said chamber.

3. A substrate enhanced sputtering system as described in claim 1 wherein said secondary tap responsive to said secondary winding of said transformer comprises a cathode connection.

4. A substrate enhanced sputtering system as described in claim 3 wherein said secondary winding has electrical ends, wherein said anode comprises at least two anodes, and wherein said electrical ends of said secondary winding are each connected to one of said anodes.

5. A substrate enhanced sputtering system as described in claim 4 wherein said secondary tap responsive to said secondary winding of said transformer comprises a center tap.

6. A substrate enhanced sputtering system as described in claim 1 wherein said secondary tap responsive to said secondary winding of said transformer comprises a substrate connection.

7. A substrate enhanced sputtering system as described in claim 6 wherein said secondary tap responsive to said secondary winding of said transformer comprises a center tap.

8. A substrate enhanced sputtering system as described in claim 6 wherein said target comprises at least two targets, wherein said secondary winding has electrical ends, and wherein said electrical ends of said secondary winding are each connected to one of said targets.

9. A substrate enhanced sputtering system as described in claim 3 wherein said secondary tap responsive to said secondary winding of said transformer further comprises a substrate connection.

10. A substrate enhanced sputtering system as described in claim 9 wherein said secondary tap responsive to said secondary winding of said transformer comprises a center tap.

11. A substrate enhanced sputtering system as described in claim 10 wherein said target comprises at least two targets, wherein said secondary winding has electrical ends, and wherein said electrical ends of said secondary winding are each connected to one of said targets.

12. A method of substrate enhanced sputtering comprising the steps of:
   a. establishing a plasma in a chamber;
   b. utilizing a transformer having a primary winding and a secondary winding in applying power to said chamber;
   c. connecting a surface involved in sputtering to a tap of said secondary winding of said transformer;
   d. sputtering material within said chamber,
   wherein said step of connecting a surface involved in sputtering to a tap of said secondary winding of said transformer comprises the step of connecting a cathode to a tap of said secondary winding of said transformer.

13. A method of substrate enhanced sputtering as described in claim 12 wherein said step of connecting a cathode to a tap of said secondary winding of said transformer comprises the step of connecting a substrate to a tap of said secondary winding of said transformer.

* * * * *